United States Patent [19]
Sato

[11] Patent Number: 6,037,818
[45] Date of Patent: Mar. 14, 2000

[54] HIGH RESOLUTION DELAY CIRCUIT HAVING COARSE AND FINE DELAY CIRCUITS

[75] Inventor: Masatoshi Sato, Saitama, Japan

[73] Assignee: Advantest Corp., Tokyo, Japan

[21] Appl. No.: 09/037,843

[22] Filed: Mar. 10, 1998

[30] Foreign Application Priority Data

Mar. 19, 1997 [JP] Japan ..................................... 9-066776

[51] Int. Cl.[7] ....................................................... H03K 5/13
[52] U.S. Cl. ........................... 327/272; 327/262; 327/270; 327/265; 327/264; 327/269
[58] Field of Search ..................................... 327/276, 277, 327/279, 161, 176, 160, 286, 270

[56] References Cited

U.S. PATENT DOCUMENTS

| | | | |
|---|---|---|---|
| 4,496,861 | 1/1985 | Bazes | 327/146 |
| 4,703,251 | 10/1987 | Baumgartner et al. | 324/617 |
| 5,570,294 | 10/1996 | McMinn et al. | 364/481 |
| 5,594,377 | 1/1997 | Choi et al. | 327/278 |
| 5,731,725 | 3/1998 | Rothenberger et al. | 327/262 |
| 5,815,009 | 9/1998 | Iadanza et al. | 327/5 |

*Primary Examiner*—Timothy P. Callahan
*Assistant Examiner*—Hiep Nguyen
*Attorney, Agent, or Firm*—Muramatsu & Associates

[57] ABSTRACT

A delay circuit is to produce a delay timing which is larger than one cycle time of a reference clock while the resolution of which is smaller than the one cycle time of the reference clock. The delay circuit includes a coarse delay circuit for producing a borrow signal having a delay time which is an integer multiple of one cycle time of a clock signal supplied thereto, a divider for dividing the frequency of the reference clock to produce the clock signal, a flip-flop circuit for delaying an incoming signal by one cycle time of the reference clock, a re-timing circuit for receiving an output signal from the flip-flop circuit and producing a coarse delay signal in synchronism with the reference clock, a decoder for receiving the borrow signal from the coarse delay circuit and selectively providing the borrow signal to either the flip-flop circuit or the re-timing circuit, and a fine delay circuit for adding a fine delay time which is smaller than the one cycle time of the reference clock to a coarse delay signal from the re-timing circuit.

15 Claims, 5 Drawing Sheets

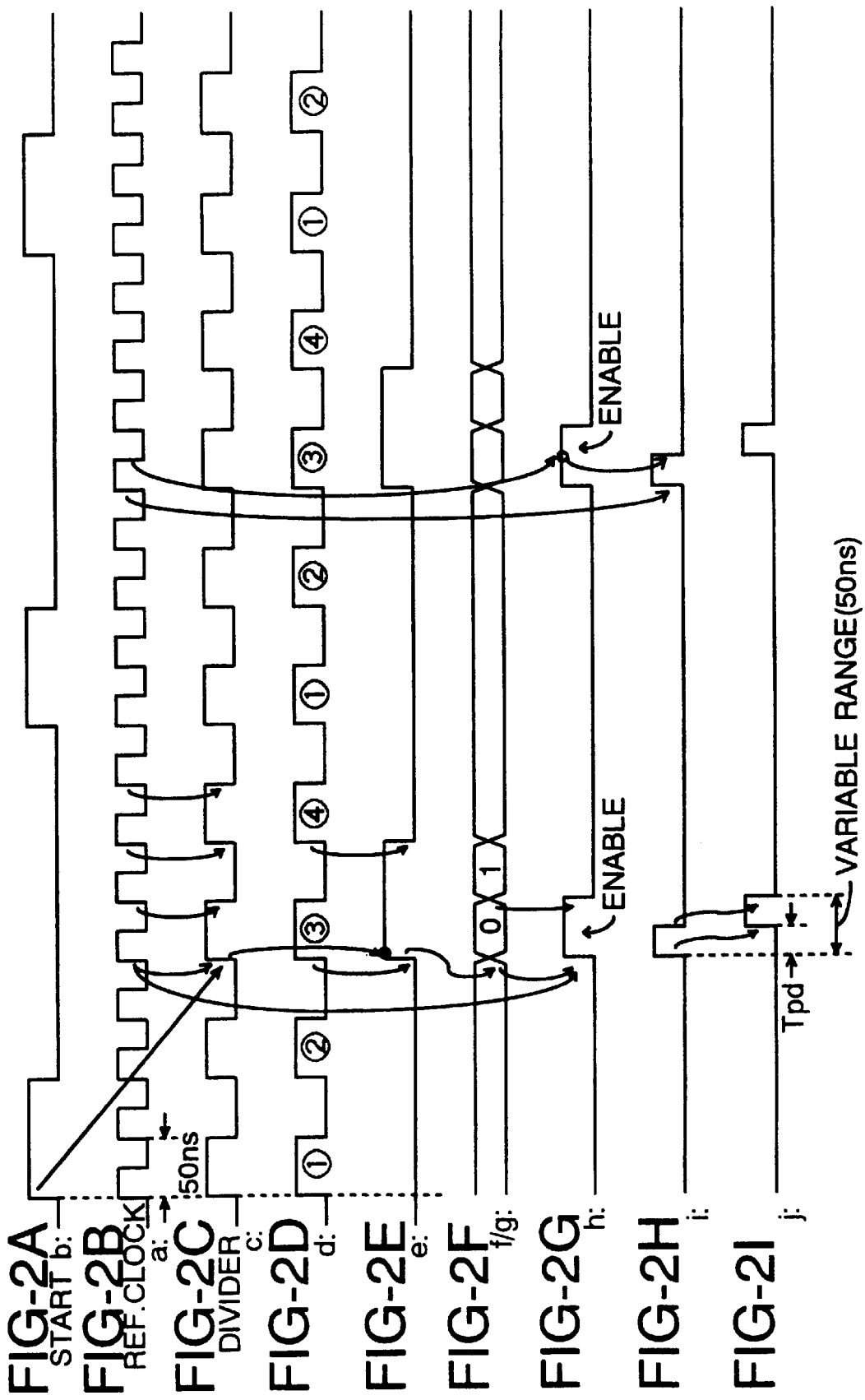

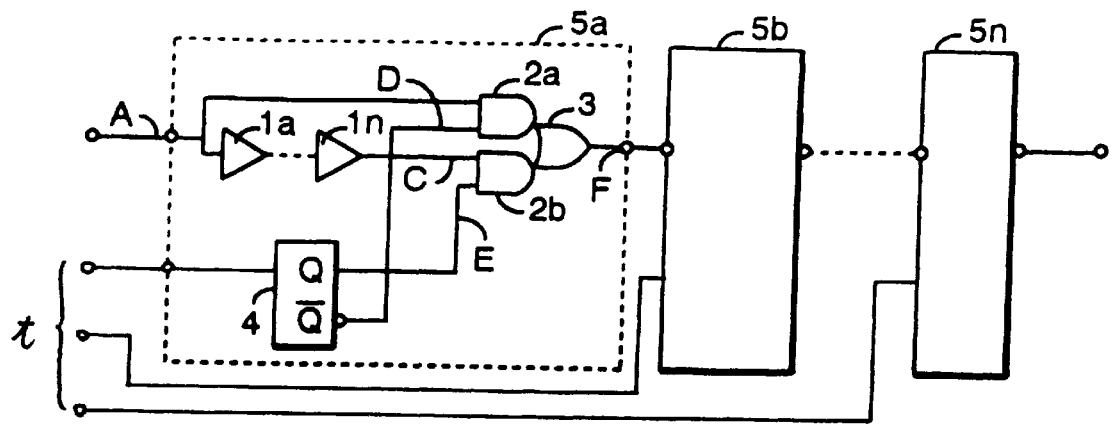
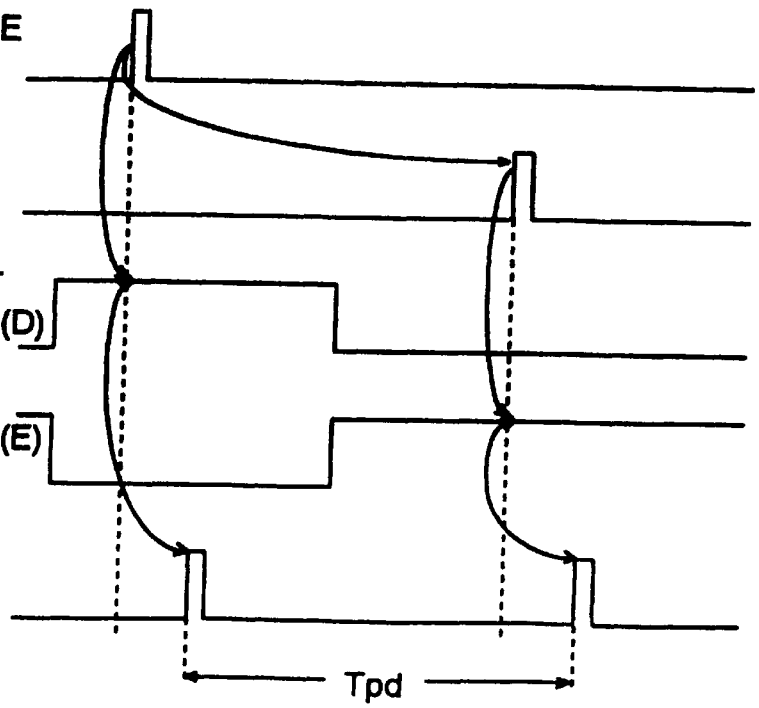

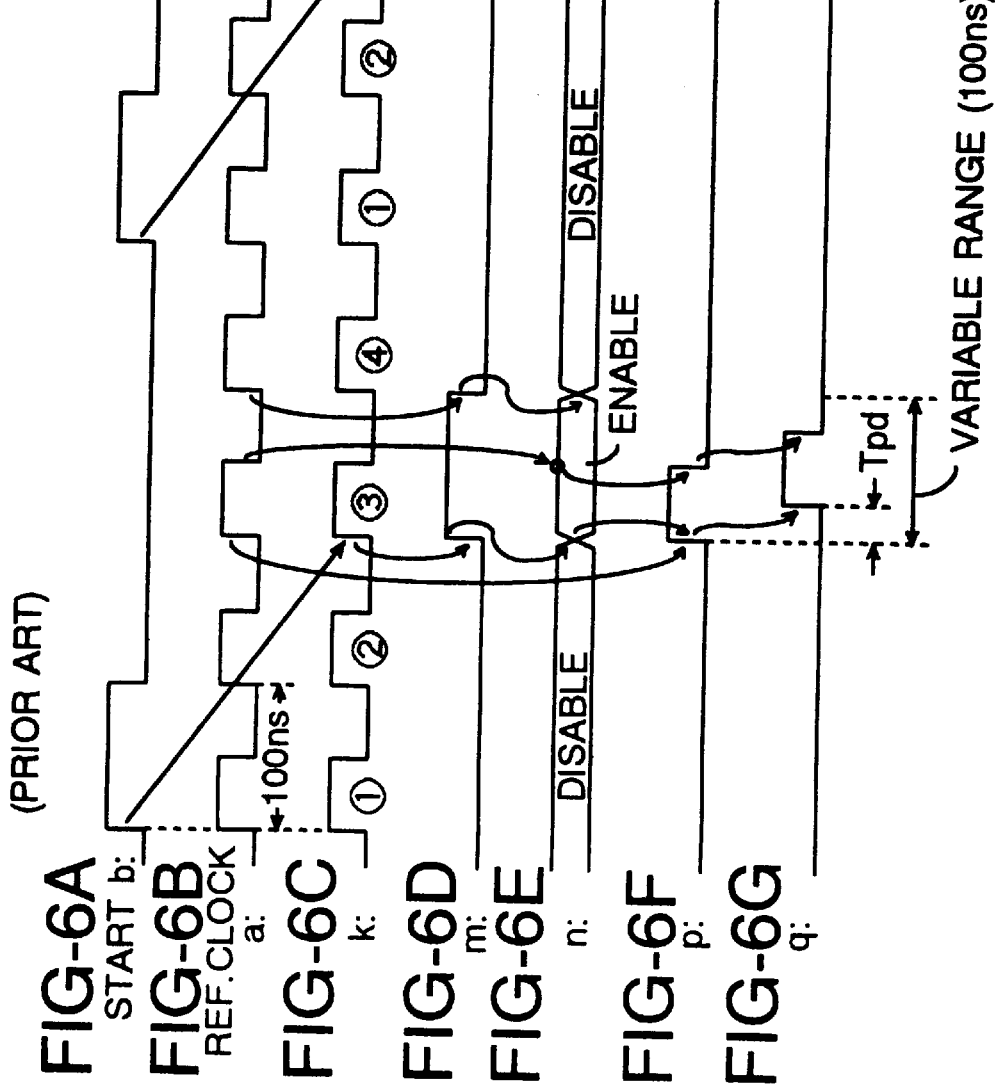

HIGH RESOLUTION DELAY CIRCUIT HAVING COARSE AND FINE DELAY CIRCUITS

FIELD OF THE INVENTION

This invention relates to a delay circuit for delaying a logic signal, and more particularly, to a high resolution delay circuit having a coarse delay circuit for producing a delay time which is an integer multiple of a time period of a reference clock and a fine delay circuit for producing a fractional delay time which is smaller than the time period of the reference clock.

BACKGROUND OF THE INVENTION

In testing a semiconductor device by a semiconductor test system, test patterns with various timings must be applied to the semiconductor device under test. The timing resolution and accuracy must be very high, such as 1/100 of a time period of a reference clock in the semiconductor test system. This invention is directed to a delay circuit for producing a high resolution delay time, although the application of the invention is not limited to semiconductor test systems.

An example of a conventional delay circuit for such a purpose is shown in FIGS. 3–6. As shown in FIG. 5, the delay circuit includes a coarse delay circuit 20, a conversion memory 31, a flip-flop 50, an AND gate 11, and a fine delay circuit 61. The delay circuit of FIG. 5 is to produce a delayed signal q at the output of the fine delay circuit 61 which is delayed by a predetermined time from a start signal b with use of a reference clock a.

The coarse delay circuit 20 is to produce a pulse signal whose delay time is integer multiple of one clock cycle (time period) of the reference clock a by counting the number of pulses of the reference clock a. In the example of FIG. 5, the coarse delay circuit 20 includes a start/stop control circuit 21, a memory 22 and a down counter 23. The start/stop control circuit 21 is provided with the start signal b and the reference clock a. The down counter 23 generates a delayed pulse (borrow signal) m which is provided to the flip-flop 50.

The fine delay circuit 61 is to add a fractional delay time which is smaller than the one cycle of the reference clock a to the delayed pulse m having a delay time which is integer multiple of the reference clock cycle from the coarse delay circuit 20. Consequently, the delayed signal q having a high resolution timing delay is produced at the output of the fine delay circuit 61. As shown in FIG. 3, the fine delay circuit 61 includes series connected small time delay circuits 5a, 5b, . . . 5n having different fractional delay times from one another. Each of the small time delay circuits 5a–5n has both a delay path for supplying a fractional delay time to an incoming signal and a through path for not supplying the fractional delay time.

The fractional delay time in the delay path is produced by a series connected delay elements 1a–1n which are formed, for example of CMOS buffers or gates. Either one of the delay path or the through path in the small time delay circuit is selected by an output of a flip-flop 4 which is controlled by a select signal t (digital codes from the conversion memory 31). An output signal F through the selected path is generated at the output of an OR gate 3 to be supplied to the next stage of the small time delay circuit 5b as shown in FIG. 3.

The operation of the delay circuit of FIG. 5 is explained with reference to the timing chart of FIG. 6. In this example, a pulse signal which is delayed by 202.5 ns relative to the start signal b is produced by the delay circuit of FIG. 5 wherein one cycle time of the reference clock is 100 ns. Further, for simplicity of explanation, the timing chart of FIG. 6 does not include a propagation delay time of each component in the delay circuit.

In the coarse delay circuit 20, the start signal b (FIG. 6A) which is synchronized with the reference clock a (FIG. 6B) is provided to the start/stop control circuit 21. The reference clock a is also provided to a clock terminal of the start/stop control circuit 21. The start signal b enables the reference clock a to pass through the start/stop control circuit 21. Thus, a clock signal k (FIG. 6C) having the same clock rate as the reference clock a is supplied to the down counter 23.

The down counter 23 receives preset data s from the memory 22 and counts the clock signal k defined by the preset data s. For example, the preset data s in this case indicates the ultimate delay timing 202.5 ns that is the delay time desired to be produced by the delay circuit of FIG. 5. Based on the higher bits of the preset data s, the down counter 23 generates a borrow signal (terminal count) m when counting the predetermined number of the clock signal k defined by the higher bits of the preset data s. In the example of FIG. 6, since the higher bits indicates a delay time of 200 ns, the borrow signal m is generated at the third pulse (200 ns after the start signal b) of the clock signal k as shown in FIG. 6D.

The borrow signal m is provided to the flip-flop circuit 50 (FIG. 6E) and is re-timed at the AND gate 11 by the reference clock a. Thus, a delayed signal p having a 200ns delay time is produced at the output of the AND gate 11 as shown in FIG. 6F. The delayed signal p is provided to the fine delay circuit 61 for further receiving a fine (fractional) delay time $T_{pd}$ which is smaller than one cycle of the reference clock a as shown in FIG. 6G.

FIG. 4 is a timing chart showing an operation of the fine delay circuit of FIG. 3. For simplicity of explanation, the timing chart of FIG. 4 does not include a signal propagation delay time of each component in the delay circuit of FIG. 3. As noted above, the fine delay circuit 61 includes the series connected small time delay circuits 5a, 5b, . . . 5n having different fractional delay times from one another. Each of the small time delay circuits 5a–5n has the series connected delay elements 1a–1n such as CMOS gates to establish the fine delay time $T_{pd}$. Either one of the delay path or the through path in the delay circuit is selected by controlling the output of the flip-flop 4 by the digital codes t.

Thus, when the output of the flip-flop 4 is as shown in FIG. 4C, the flip-flop 4 selects the delay path by opening the AND gate 2b. In the delay path, the delay time $T_{pd}$ produced by the delay elements 1a–1n is added to the input signal A of FIG. 4A to form a delayed signal c shown in FIG. 4B. Thus, the output of the small time delay circuit 5a provides the delayed signal F (FIG. 4D) to the next small time delay circuit 5b. In this manner, the fractional delay time $T_{pd}$ which is smaller than the reference clock cycle is added to the input signal by the fine delay circuit 61.

Typically, the small time delay circuits 5a–5n have different number of the delay elements to establish the different fractional delay times $T_{pd}$ from the other. To produce a longer delay time, a larger number of delay elements 1a–1n must be assigned in the delay circuit 61. By selecting one or more small time delay circuits, a desired fine delay time which is smaller than the one reference clock cycle can be produced.

For example, the small time delay circuit 5a has a delay time which is a half (½) of the one cycle of the reference clock a. The delay circuit 5b has a delay time which is a half of that of the delay circuit 5a. Similarly, the delay circuit 5c has a delay time which is a half of that of the delay circuit 5b, and the delay circuit 5d has a delay time which is a half of that of the delay circuit 5c, and so on. Thus, in case where one cycle of the reference clock a is 100 ns and the intended timing resolution is 0.1 ns, the fine delay circuit 61 will be formed of ten (10) small time delay circuits 5 having delay times of 50 ns, 25 ns, 12.5 ns, 6.3 ns, 3.2 ns, 1.6 ns, 0.8 ns, 0.4 ns, 0.2 ns, and 0.1 ns, respectively.

The digital codes t for controlling the small time delay circuits 5a–5n are provided by the conversion memory 31. The digital codes are produced by the conversion memory 31 by reading digital data r in the memory 22 in the coarse delay circuit 20. In the above example of generating the delay time of 202.5 ns, the fine delay circuit 61 must provides a delay time of 2.5 ns to the incoming signal. Thus, the small time delay circuits 5 of 1.6 ns, 0.8 ns and 0.1 ns are respectively selected by the digital codes. Therefore, in FIG. 5, the 200 ns delayed signal P at the input of the fine delay circuit 61 is provided with the delay time of 2.5 ns to establish the intended delay time of 202.5ns.

In the conventional delay circuit of FIGS. 3–6, the fractional delay times $T_{pd}$ in the small time delay circuits 5a–5n are dependent upon the time period of the reference clock. If the time period of the reference clock is increased, the fine delay circuit 61 to cover the delay times smaller than one cycle period of the reference clock must have capability of adjusting longer delay times corresponding to the reference clock. Consequently, the number of delay elements such as CMOS gates in the fine delay circuit must be increased. Not only increasing the number of components, but the longer delay time also decreases the timing accuracy and resolution. Further, the capacity of the memory 31 must also be increased since the digital codes to control the fine delay circuits need to have larger bits.

In case where the time period of the reference clock is shortened, i.e., the frequency of the reference clock is increased, electric power consumption by the CMOS gate forming the delay elements will increase. The increase of the power consumption in the delay circuit also causes thermal noise to a signal propagating therethrough. Further, such an increase in the frequency of the reference clock is limited by the operational speed of the coarse delay circuit 20. Moreover, the increase in the operational speed in the delay circuit requires high cost circuit components.

SUMMARY OF THE INVENTION

Therefore, it is an object of the present invention to provide a delay circuit which is capable of producing high resolution and accuracy delay timings while decreasing the number of circuit components.

It is another object of the present invention to provide a delay circuit which is less susceptible to thermal noise caused by the components forming the delay circuit or external noise by decreasing the number of circuit components and reducing a signal path length.

It is a further object of the present invention to provide a delay circuit which utilizes higher frequencies of the reference clock without increasing electric power consumption therein.

It is a further object of the present invention to provide a delay circuit which has a small physical size and low cost by significantly decreasing the number of circuit components used therein.

The delay circuit of the present invention is to produce a delay timing which is longer than one cycle time of a reference clock while resolution of the delay timing is smaller than the one cycle time of the reference clock. The delay circuit of the present invention includes: a coarse delay circuit for producing a borrow signal having a delay time which is an integer multiple of one cycle time of a clock signal supplied thereto; a divider for dividing a frequency of the reference clock to produce the clock signal supplied to the coarse delay circuit; a flip-flop circuit which is supplied with the reference clock signal for delaying an incoming signal by one time period of the reference clock; a re-timing circuit for receiving an output signal from the flip-flop circuit and producing a coarse delay signal in synchronism with the reference clock; a decoder for receiving the borrow signal from the coarse delay circuit and selectively providing the borrow signal to either the flip-flop circuit or the re-timing circuit; and a fine delay circuit for adding a fine delay time which is smaller than the one cycle time of the reference clock to the coarse delay signal from the re-timing circuit.

In the delay circuit of the present invention, the above noted coarse delay circuit includes: a start/stop control circuit which is provided with a start signal for which the delay timing is produced by the delay circuit, and the clock signal from the divider wherein said start/stop control circuit generates the clock signal in synchronism with the start signal; a memory for storing delay data representative of the delay timing; and a down counter for counting the number of pulses of the clock signal from the start/stop control circuit and generating the borrow signal when reaching a predetermined value of the counted data defined by the delay data from the memory.

In the delay circuit of the present invention, the above noted fine delay circuit is formed with a plurality of small time delay time circuits connected in series, wherein each of the small time delay time circuit includes: a through path for propagating an incoming signal without delay; a delay path for providing a fractional delay time to the incoming signal where the delay path includes a plurality of delay elements connected in series with one another; and a selector for selecting either one of the through path or the delay path based on a select signal originated by the delay data stored in the memory.

According to the delay circuit of the present invention, high resolution and accuracy delay timings will be produced while decreasing the number of circuit components such as delay elements and the capacity of the memory used therein. Further, the delay circuit of the present invention is less susceptible to thermal noise caused by the circuit components forming the delay circuit or external noise because the number of circuit components and the signal path length in the delay circuit are significantly reduced.

Moreover, the delay circuit of the present invention using active components as the delay elements can be operated with higher frequency of the reference clock without increasing electric power consumption by the active components. Because of the decrease in the number of circuit components and the memory capacity, the delay circuit of the present invention can be furnished with small physical size and low cost.

BRIEF DESCRIPTION OF THE DRAWINGS

FIG. 2 is a timing chart showing an operation of the delay circuit of the present invention.

FIG. 3 is a block diagram showing a structure of a fine delay circuit for producing a delay time which is smaller than a time period of a reference clock.

FIG. 4 is a timing chart showing an operation of the fine delay circuit of FIG. 3.

FIG. 6 is a timing chart showing an operation of a logic delay circuit in the conventional delay circuit of FIG. 5.

DETAILED DESCRIPTION OF THE PREFERRED EMBODIMENTS

Figure 1:
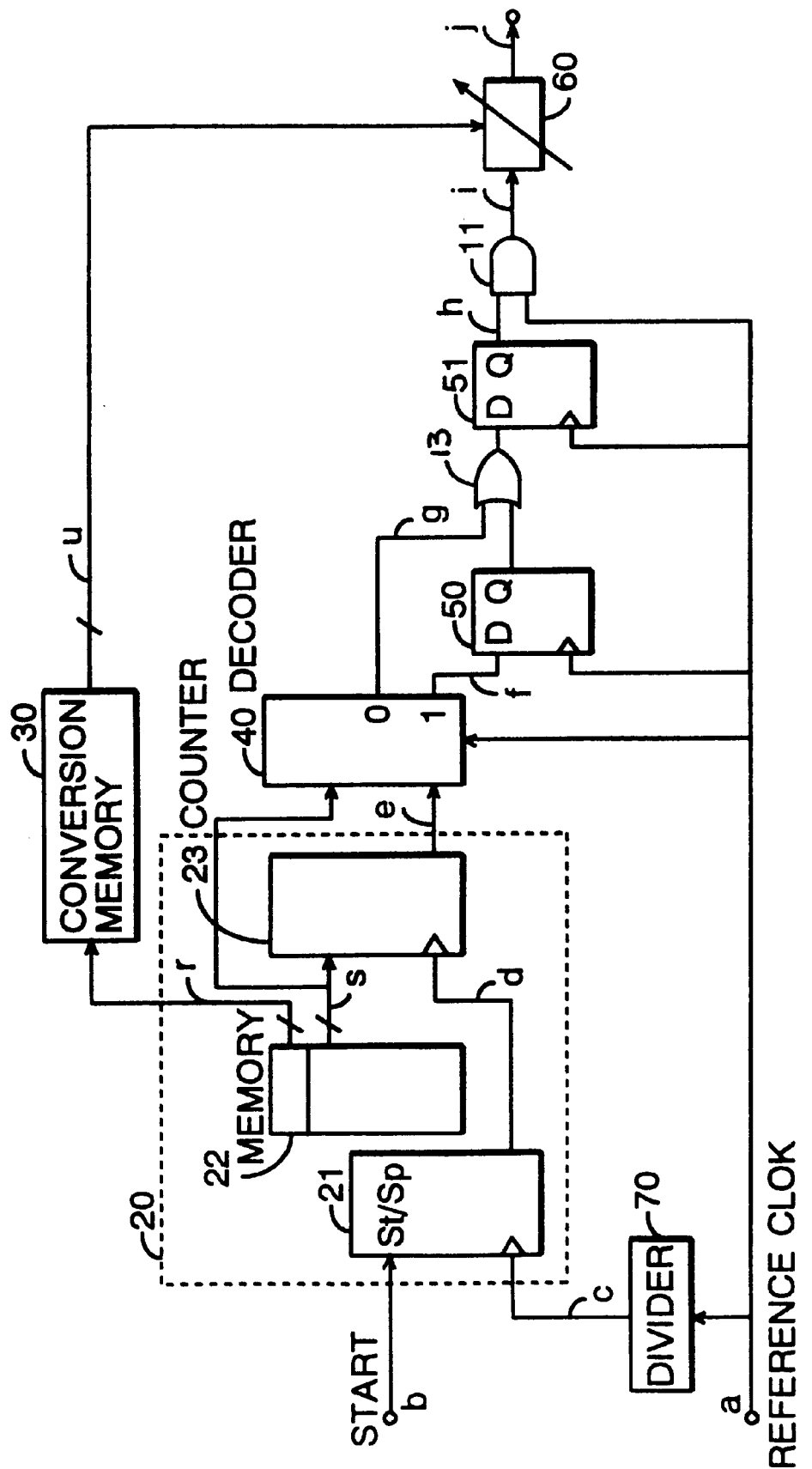
FIG. 1 is a block diagram showing a structure of a delay circuit of the present invention.

The embodiment of the present invention is explained with reference to FIGS. 1 and 2. As shown in FIG. 1, the delay circuit of the present invention comprises a coarse delay circuit 20, a conversion memory 30, flip-flop circuits 50 and 51, an OR gate 13, an AND gate 11, a fine delay circuit 60, a decoder 40, and a divider 70. The structure and function of the coarse delay circuit 20 and the fine delay circuit 60 is basically the same as that of the conventional technology explained with reference to FIGS. 3–6.

As shown in FIG. 1, the divider 70 is provided between the reference clock and the start/stop control circuit 21. Thus, the start/stop control circuit 21 receives a reference clock signal which has been frequency divided by the divider 70. The decoder 40 is provided with preset data from the memory 22 and a borrow signal (terminal count) from the down counter 23. The decoder 70 produces an output signal either at an output terminal 0 or 1 depending on the value shown in the preset data. The output signal from the decoder 40 is re-timed by the flip-flop 51 and AND gate 11 with respect to the reference clock. The output of the AND gate 11 is supplied to the fine delay circuit 60 where it is provided with a fractional delay time which is smaller than the time period of the reference clock.

The operation of the delay circuit of the present invention is explained with reference to the timing chart of FIG. 2. The explanation is made for the case where a delay timing of 202.5 ns is produced as an ultimate output of the delay circuit of FIG. 1. Also in this example, the frequency of the reference clock is two times higher than that of the example of FIG. 6, i.e, one cycle period is 50 ns rather than 100 ns. To divide the reference clock frequency into two, i.e., a clock rate of 100 ns, a division ratio N of the divider 70 is set to N=2.

Figure 5:
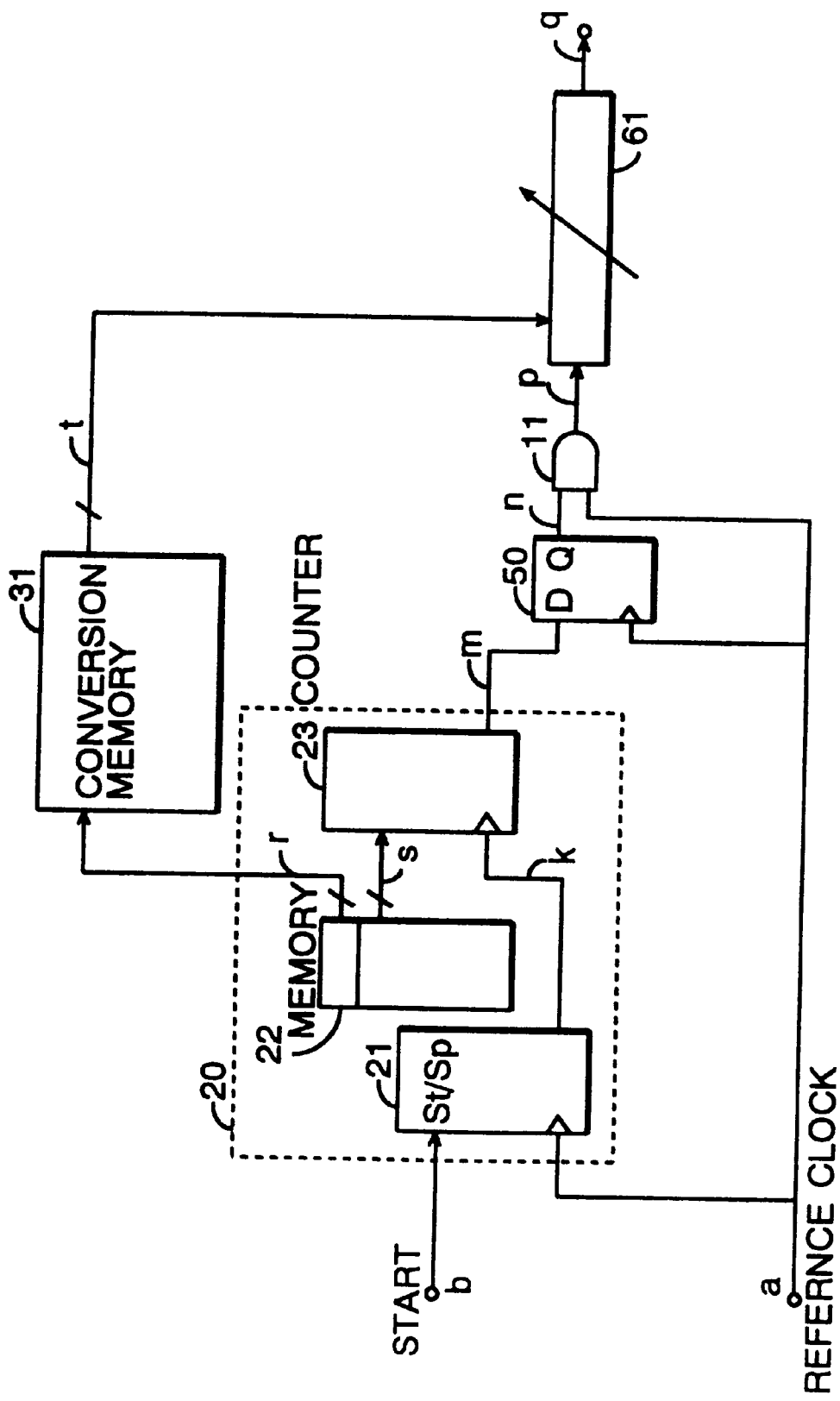
FIG. 5 is a block diagram showing a structure of a delay circuit in the conventional technology.

In this case, the coarse delay circuit 20 functions in the same manner as shown in FIGS. 5 and 6. In the coarse delay circuit 20, the start signal b shown in FIG. 2A which is synchronized with the reference clock a shown in FIG. 2B is provided to the start/stop control circuit 21. The divided reference clock c having a 100 ns interval (FIG. 2C) is also provided to a clock terminal of the start/stop control circuit 21 from the divider 70. The start signal b enables the divided reference clock c to pass through the start/stop control circuit 21 so that the clock signal d shown in FIG. 2D is supplied to the down counter 23. Thus, the clock signal d has a time period of 100 ns.

The down counter 23 receives preset data s from the memory 22 and counts the clock signal d defined by the preset data s. Similar to the example of FIGS. 5 and 6, the preset data s indicates the ultimate delay timing 202.5 ns that is to be produced by the delay circuit 20. Based on the preset data s, the down counter 23 generates a borrow signal (terminal count) e when reaching the predetermined number of clock signal d defined by the higher bits of the preset data s. In the example of FIG. 2, since the higher bits indicates a delay time of 200 ns, the borrow signal e is generated at the third pulse (200 ns after the start signal b) of the clock signal d as shown in FIG. 2E.

The borrow signal e is provided to the decoder 40 whose other terminal is provided with the preset data s from the memory 22. The decoder 40 determines whether the ultimate delay timing is between 200 ns and 250 ns (200 ns plus 50ns, i.e, one cycle of the reference clock a) or between 200 ns and 300 ns (200 ns plus 100 ns, i.e., two cycles of the reference clock a). Since the preset data s from the memory 22 shows the ultimate delay timing of 202.5 ns, the decoder 40 produces an output signal g which is supplied to the OR gate 13 as shown in FIG. 2F. If the data from the memory 22 indicates a delay time greater than 250 ns but smaller than 300 ns, the decoder produces an output signal f which is supplied to the flip-flop 50. In such a case, by the flip-flop 50 and the reference clock supplied thereto, the signal f will be provided with a delay time amount to one cycle time of the reference clock a to produce a 250 ns delay time.

The output of the OR gate 13 is provided to the flip-flop 51 whose output signal (FIG. 2G) is re-timed in the AND gate 11 by the reference clock a. Thus, a delayed signal i having the 200 ns delay time is produced at the output of the AND gate 11 as shown in FIG. 2H. The delayed signal i is provided to the fine delay circuit 61 for further receiving a fractional delay time $T_{pd}$ which is smaller than one cycle of the reference clock a and generated as the ultimate delay timing j as shown in FIG. 2I.

The fractional delay time $T_{pd}$ is produced by the fine delay circuit 60 in the manner described with reference to FIGS. 3 and 4. In this example, the fractional delay time of 2.5 ns is added to the signal i from the AND gate 11 by the fine delay time 60. To establish the 2.5 ns fractional delay time, digital codes u from the conversion memory 30 control the small time delay circuits such as shown in FIG. 3 forming the fine delay circuit 60. The digital codes u are produced by reading the digital data r in the memory 22 and converting the digital data r by the conversion memory 30. Thus, small time delay circuits of 1.6 ns, 0.8 ns, 0.1 ns will be selected to establish the fractional delay time of 2.5ns in the fine delay circuit 60, resulting in the delay timing j of FIG. 2I having 202.5 ns delay time.

The operation of the fine delay circuit 60 is basically the same as that of FIGS. 3 and 4. In the example of FIGS. 1 and 2, however, the time period of the reference clock a is 50 ns which is a half of the example of FIG. 6. Thus, the small time delay circuit 5a (FIG. 3) having the largest fraction delay needs to have a fractional delay time of 25 ns, which is a half (½) of the one cycle of the reference clock a. The small time delay circuit 5b has a delay time which is a half of that of the delay circuit 5a. The delay circuit 5c has a delay time which is a half of that of the delay circuit 5b, and so on. Thus, in case where the intended timing resolution is 0.1 ns, the fine delay circuit 61 will be formed of nine (9) small time delay circuits 5 having delay times of 25 ns, 12.5 ns, 6.3 ns, 3.2 ns, 1.6 ns, 0.8 ns, 0.4 ns, 0.2 ns, and 0.1 ns, respectively.

This means that the number of the delay elements required in the fine delay circuit 60 will be decreased to a half of that required in the fine delay circuit 61 of FIG. 3 because the delay time of 50 ns is no longer necessary. Consequently, suppose each delay element (such as CMOS gate) has a delay time of 0.1 ns, 500 delay elements (CMOS gates) will be eliminated. Further, because of the decrease in the number of delay elements, such as 500 delay elements as above, the data bits from the conversion memory 30 to control the fine delay circuit 60 will be accordingly decreased.

The present invention requires the additional components such as the divider 70, the decoder 40, the flip-flop 51 and the OR gate 13. However, In view of the dramatic decrease in The number of delay elements typically formed by CMOS gates in the overall delay circuit, such an increase in the components is negligible.

In the foregoing, the present invention is described in the case wherein the frequency of the reference clock is increased by two times, i.e., the time period is decreased to ½ of the conventional example. However, similar embodiment can be achieved when the frequency of the reference clock is increased by N times, i.e, the time period is decreased by 1/N times. In such a situation, the similar results will be achieved by setting a 1/N division ratio in the divider 70, having N outputs in the decoder 40 and arranging N flip-flops in series in the circuit example of FIG. 1. Thus, the number of delay elements, such as CMOS gates in the delay circuit is further decreased by the factor of 1/N, since the fractional delay time required by the fine delay circuit is decreased by 1/N.

For the purpose of explanation, the above embodiment has been explained for the case where the clock cycle is relatively long such as 100 ns. However, in an actual delay circuit, more higher clock rates, such as a few nanosecond and higher resolution of the fine delay time, such as in the order of few picoseconds may be used. The present invention is feasible in such a high speed operation with the use of semiconductor devices available in the market.

As explained above, the delay circuit of the present invention utilizes a reference clock of N-times higher, i.e., a time period of 1/N lower than the corresponding conventional example. The reference clock is divided by 1/N so that the logic delay circuit can operate by the clock rate lower than the reference clock rate by 1/N. Since the reference clock time period is reduced to 1/N, the range of the fine delay time is decreased to 1/N accordingly.

As has been described in the foregoing, according to the delay circuit of the present invention, high resolution and accuracy delay timings will be produced while decreasing the number of circuit components such as delay elements and the memory capacity used therein. Further, the delay circuit of the present invention is less susceptible to thermal noise caused by the circuit components forming the delay circuit or external noise because the number of circuit components and the signal path length in the delay circuit are significantly reduced.

Moreover, the delay circuit of the present invention using active components as the delay elements can be operated with higher frequency of the reference clock without increasing electric power consumption by the active components. Because of the decrease in the number of circuit components and the memory capacity, the delay circuit of the present invention can be furnished with a small physical size and low cost.

What is claimed is:

1. A delay circuit for producing a delay timing which is longer than one cycle time of a reference clock while resolution of the delay timing is smaller than said one cycle time of said reference clock, comprising:
   a coarse delay circuit for producing a borrow signal having a delay time which is an integer multiple of one cycle time of a clock signal supplied thereto;
   a divider for dividing a frequency of said reference clock to produce said clock signal supplied to said coarse delay circuit;
   a flip-flop circuit which is supplied with said reference clock for delaying an incoming signal by one time period of said reference clock;
   a re-timing circuit for receiving an output signal from said flip-flop circuit and producing a coarse delay signal in synchronism with said reference clock;
   a decoder for receiving said borrow signal from said coarse delay circuit and selectively providing said borrow signal to either said flip-flop circuit or said re-timing circuit; and
   a fine delay circuit for adding a fine delay time which is smaller than said one cycle time of said reference clock to said coarse delay signal from said re-timing circuit.

2. A delay circuit as defined in claim 1, wherein said coarse delay circuit, comprising:
   a start/stop control circuit which is provided with a start signal for which said delay timing is produced by said delay circuit, and said clock signal from said divider, said start/stop control circuit generating said clock signal in synchronism with said start signal;
   a memory for storing delay data representative of said delay timing; and
   a down counter for counting the number of pulses of said clock signal from said start/stop control circuit and generating said borrow signal when reaching the counted number to a predetermined value defined by said delay data from said memory.

3. A delay circuit as defined in claim 2, wherein said fine delay circuit is formed with a plurality of fractional delay time circuits connected in series, wherein each of said fractional delay time circuits comprising:
   a through path for propagating an incoming signal without delay;
   a delay path for providing a fractional delay time to said incoming signal, said delay path including a plurality of delay elements connected in series with one another; and
   a selector for selecting either one of said through path or said delay path based on a select signal originated by said delay data stored in said memory.

4. A delay circuit as defined in claim 3, wherein each of said delay elements is a CMOS gate having a small amount of signal propagation delay time.

5. A delay circuit as defined in claim 3, wherein said select signal for said fine delay circuit is produced by converting said delay data from said memory to digital codes by a conversion memory provided in said delay circuit.

6. A delay circuit as defined in claim 5, wherein said delay data stored in said memory represents said delay timing to be produced by said delay circuit.

7. A delay circuit for producing a delay timing which is longer than one cycle time of a reference clock while resolution of the delay timing is smaller than the one cycle time of the reference clock, comprising:
   a coarse delay circuit for producing a borrow signal having a delay time which is an integer multiple of one cycle time of a clock signal supplied thereto;
   a divider for dividing a frequency of said reference clock by a factor of N to produce said clock signal whose frequency is 1/N of said reference clock to supply a clock time period which is N times larger than said one cycle time of said reference clock to said coarse delay circuit;
   N series connected flip-flop circuits, each of which is supplied with said reference clock signal for delaying an incoming signal by said one cycle time of said reference clock;
   a re-timing circuit for receiving an output signal from the last stage of said flip-flop circuits and producing a coarse delay signal in synchronism with said reference clock;

a decoder for receiving said borrow signal from said coarse delay circuit and selectively providing said borrow signal to either one of said flip-flop circuits or said re-timing circuit; and a fine delay circuit for adding a fine delay time which is smaller than said one cycle time of said reference clock to said coarse delay signal from said re-timing circuit.

8. A delay circuit as defined in claim 7, wherein said coarse delay circuit, comprising:

a start/stop control circuit which is provided with a start signal for which said delay timing is produced by said delay circuit, and said clock signal from said divider, said start/stop control circuit generating said clock signal in synchronism with said start signal;

a memory for storing delay data representative of said delay timing; and a down counter for counting the number of pulses of said clock signal from said start/stop control circuit and generating said borrow signal when reaching the counted number to a predetermined value defined by said delay data from said memory.

9. A delay circuit as defined in claim 7, wherein said fine delay circuit is formed with a plurality of fractional delay time circuits connected in series, wherein each of said fractional delay time circuits comprising:

a through path for propagating an incoming signal without delay;

a delay path for providing a fractional delay time to said incoming signal, said delay path including a plurality of delay elements connected in series with one another; and a selector for selecting either one of said through path or said delay path based on a select signal originated by said delay data stored in said memory.

10. A delay circuit as defined in claim 9, wherein each of said delay elements is a CMOS gate having a small amount of signal propagation delay time.

11. A delay circuit for producing a delay timing based on delay data stored in a memory, comprising:

a divider for dividing a frequency of a reference clock to produce a clock signal;

a coarse delay circuit provided with said clock signal from said divider for producing a coarse delay signal having a delay time which is an integer multiple of one cycle time of said clock signal supplied thereto;

a plurality of flip-flop circuits series connected with one another and provided with said reference clock, each of said flip-flop circuits delaying an incoming signal by one cycle time of said reference clock;

means for providing said coarse delay signal from said coarse delay circuit to one of said flip-flop circuits based on said delay data; and a fine delay circuit for adding a fine delay time which is smaller than said one cycle time of said reference clock to an output signal from said one of said flip-flops.

12. A delay circuit as defined in claim 11, further comprising a re-timing circuit provided between said flip-flop circuits and said fine delay circuit for synchronizing said output signal from one of said flip-flop circuits with said reference clock.

13. A delay circuit as defined in claim 11, wherein said coarse delay circuit, comprising:

a start/stop control circuit which is provided with said clock signal from said divider and a start signal for which said delay timing is produced by said delay circuit, said start/stop control circuit generating said clock signal in synchronism with said start signal; and a down counter for presetting said delay data from said memory and counting the number of pulses of said clock signal from said start/stop control circuit, said down counter generating said coarse delay signal when a counted number reaching a predetermined value defined by said delay data.

14. A delay circuit as defined in claim 11, wherein said fine delay circuit is formed with a plurality of fractional delay time circuits connected in series, wherein each of said fractional delay time circuits comprising:

a through path for propagating an incoming signal without delay;

a delay path for providing a fractional delay time to said incoming signal, said delay path including a plurality of delay elements connected in series with one another; and a selector for selecting either one of said through path or said delay path based on a select signal originated by said delay data stored in said memory.

15. A delay circuit as defined in claim 11, wherein said means for providing said coarse delay signal is a decoder which selectively provides said coarse delay signal to one of said flip-flop circuits in response to said delay data from said memory.

* * * * *